US006826107B2

(12) United States Patent
Dvir et al.

(10) Patent No.: US 6,826,107 B2
(45) Date of Patent: Nov. 30, 2004

(54) HIGH VOLTAGE INSERTION IN FLASH MEMORY CARDS

(75) Inventors: Ran Dvir, Beit Yehoshua (IL); Zeev Cohen, Safed (IL)

(73) Assignees: Saifun Semiconductors Ltd., Netanya (IL); Infineon Technologies Flash Ltd., Netanya (IL)

( * ) Notice: Subject to any disclaimer, the term of this patent is extended or adjusted under 35 U.S.C. 154(b) by 0 days.

(21) Appl. No.: 10/209,644

(22) Filed: Aug. 1, 2002

(65) Prior Publication Data

US 2004/0022113 A1 Feb. 5, 2004

(51) Int. Cl.[7] .................................................. G11C 7/00
(52) U.S. Cl. ................................... 365/226; 365/185.33
(58) Field of Search ........................... 365/226, 185.33, 365/189.04

(56) References Cited

U.S. PATENT DOCUMENTS

| | | |
|---|---|---|
| 3,895,360 A | 7/1975 | Cricchi et al. |
| 4,016,588 A | 4/1977 | Ohya et al. |
| 4,017,888 A | 4/1977 | Christie et al. |
| 4,151,021 A | 4/1979 | McElroy |
| 4,173,766 A | 11/1979 | Hayes |
| 4,173,791 A | 11/1979 | Bell |
| 4,257,832 A | 3/1981 | Schwabe et al. |
| 4,281,397 A | 7/1981 | Neal et al. |
| 4,306,353 A | 12/1981 | Jacobs et al. |
| 4,342,149 A | 8/1982 | Jacobs et al. |
| 4,360,900 A | 11/1982 | Bate |
| 4,380,057 A | 4/1983 | Kotecha et al. |
| 4,388,705 A | 6/1983 | Sheppard |
| 4,389,705 A | 6/1983 | Sheppard |
| 4,471,373 A | 9/1984 | Shimizu et al. |
| 4,521,796 A | 6/1985 | Rajkanan et al. |
| 4,527,257 A | 7/1985 | Cricchi |

(List continued on next page.)

FOREIGN PATENT DOCUMENTS

| | | |
|---|---|---|
| EP | 0693781 | 1/1996 |
| EP | 0751560 | 1/1997 |
| EP | 1073120 | 1/2001 |
| GB | 1297899 | 11/1972 |
| GB | 2157489 | 10/1985 |
| JP | 04226071 | 8/1992 |
| JP | 04291962 | 10/1992 |
| JP | 05021758 | 1/1993 |
| JP | 07193151 | 7/1995 |
| JP | 09162314 | 6/1997 |
| JP | 11162182 | 6/1999 |
| WO | WO 81/00790 | 3/1981 |
| WO | WO 96/25741 | 8/1996 |
| WO | WO 96/15553 | 5/1999 |
| WO | WO 99/31670 | 6/1999 |

OTHER PUBLICATIONS

Chan et al., "*A True Single–Transistor Oxide–Nitride–Oxide EEPROM Device*," IEEE Electron Device Letters, vol. EDL–8, No. 3, Mar. 1987.

Eitan et al., "*Hot–Electron Injection into the Oxide in n–Channel MOS Devices*," IEEE Transactions on Electron Devices, vol. ED–38, No. 3, pp. 328–340, Mar. 1981.

(List continued on next page.)

*Primary Examiner*—Thong Q. Le
(74) *Attorney, Agent, or Firm*—Eitan, Pearl, Latzer & Cohen Zedek, LLP

(57) ABSTRACT

A flash memory card including a controller, at least one control pad, at least one memory, and a high voltage switch logic module in communication with the at least one control pad, the controller and the at least one memory, the high voltage switch logic module being adapted to selectively route voltage from the at least one control pad to one of the controller and the at least one memory. If the voltage input to the at least one control pad does not exceed a predefined level, then the voltage may be routed from the at least one control pad to the controller. If the voltage input to the at least one control pad exceeds the predefined level, then the voltage may be routed from the at least one control pad to the at least one memory.

24 Claims, 2 Drawing Sheets

U.S. PATENT DOCUMENTS

| | | |
|---|---|---|
| 4,586,163 A | 4/1986 | Koike |
| 4,613,956 A | 9/1986 | Paterson et al. |
| 4,630,085 A | 12/1986 | Koyama |
| 4,667,217 A | 5/1987 | Janning |
| 4,742,491 A | 5/1988 | Liang et al. |
| 4,769,340 A | 9/1988 | Chang et al. |
| 4,780,424 A | 10/1988 | Holler et al. |
| 4,847,808 A | 7/1989 | Kobatake |
| 4,870,470 A | 9/1989 | Bass, Jr. et al. |
| 4,916,671 A | 4/1990 | Ichiguchi |
| 4,941,028 A | 7/1990 | Chen et al. |
| 5,021,999 A | 6/1991 | Kohda et al. |
| 5,042,009 A | 8/1991 | Kazerounian et al. |
| 5,075,245 A | 12/1991 | Woo et al. |
| 5,104,819 A | 4/1992 | Freiberger et al. |
| 5,117,389 A | 5/1992 | Yiu |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,241,497 A | 8/1993 | Komarek |
| 5,260,593 A | 11/1993 | Lee |
| 5,268,861 A | 12/1993 | Hotta |
| 5,289,412 A | 2/1994 | Frary et al. |
| 5,293,563 A | 3/1994 | Ohta |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,359,554 A | 10/1994 | Odake et al. |
| 5,375,094 A | 12/1994 | Naruke |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,504,875 A * | 4/1996 | Mills et al. ............ 365/189.02 |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,537,358 A | 7/1996 | Fong |
| 5,553,018 A | 9/1996 | Wang et al. |
| 5,563,823 A | 10/1996 | Yiu et al. |
| 5,568,085 A | 10/1996 | Eitan et al. |
| 5,583,808 A | 12/1996 | Brahmbhatt |
| 5,592,417 A | 1/1997 | Mirabel |
| 5,599,727 A | 2/1997 | Hakozaki et al. |
| 5,606,523 A | 2/1997 | Mirabel |
| 5,623,438 A | 4/1997 | Guritz et al. |
| 5,636,288 A | 6/1997 | Bonneville et al. |
| 5,654,568 A | 8/1997 | Nakao |
| 5,656,513 A | 8/1997 | Wang et al. |
| 5,661,060 A | 8/1997 | Gill et al. |
| 5,683,925 A | 11/1997 | Irani et al. |
| 5,689,459 A | 11/1997 | Chang et al. |
| 5,712,814 A | 1/1998 | Fratin et al. |
| 5,715,193 A | 2/1998 | Norman |
| 5,726,946 A | 3/1998 | Yamagata et al. |
| 5,751,037 A | 5/1998 | Aozasa et al. |
| 5,754,475 A | 5/1998 | Bill et al. |
| 5,760,445 A | 6/1998 | Diaz |
| 5,768,192 A | 6/1998 | Eitan |
| 5,768,193 A | 6/1998 | Lee et al. |
| 5,777,919 A | 7/1998 | Chi-Yung et al. |
| 5,784,314 A | 7/1998 | Sali et al. |
| 5,787,036 A | 7/1998 | Okazawa |
| 5,793,079 A | 8/1998 | Georgescu et al. |
| 5,801,076 A | 9/1998 | Ghneim et al. |
| 5,812,449 A | 9/1998 | Song |
| 5,812,456 A | 9/1998 | Hull et al. |
| 5,822,256 A * | 10/1998 | Bauer et al. ................ 365/200 |
| 5,825,686 A | 10/1998 | Schmitt-Landsiedel et al. |
| 5,828,601 A | 10/1998 | Hollmer et al. |
| 5,834,851 A | 11/1998 | Ikeda et al. |
| 5,836,772 A | 11/1998 | Chang et al. |
| 5,841,700 A | 11/1998 | Chang |
| 5,847,441 A | 12/1998 | Cutter et al. |
| 5,862,076 A | 1/1999 | Eitan |
| 5,864,164 A | 1/1999 | Wen |
| 5,870,335 A | 2/1999 | Khan et al. |
| 5,886,927 A | 3/1999 | Takeuchi |
| 5,892,710 A | 4/1999 | Fazio et al. |
| 5,903,031 A | 5/1999 | Yamamda et al. |
| 5,946,258 A | 8/1999 | Everett et al. |
| 5,946,558 A | 8/1999 | Hsu |
| 5,949,728 A | 9/1999 | Liu et al. |
| 5,963,412 A | 10/1999 | En |
| 5,963,465 A | 10/1999 | Eitan |
| 5,966,603 A | 10/1999 | Eitan |
| 5,969,993 A | 10/1999 | Takeshima |
| 5,973,373 A | 10/1999 | Krautschneider et al. |
| 5,990,526 A | 11/1999 | Bez et al. |
| 5,991,202 A | 11/1999 | Derhacobian et al. |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,034,896 A | 3/2000 | Ranaweera et al. |
| 6,063,666 A | 5/2000 | Chang et al. |
| 6,081,456 A | 6/2000 | Dadashev |
| 6,097,639 A | 8/2000 | Choi et al. |
| 6,108,241 A | 8/2000 | Chevallier |
| 6,128,226 A | 10/2000 | Eitan et al. |
| 6,134,156 A | 10/2000 | Eitan |
| 6,137,718 A | 10/2000 | Reisinger |
| 6,147,904 A | 11/2000 | Liron |
| 6,157,570 A | 12/2000 | Nachumovsky |
| 6,163,048 A | 12/2000 | Hirose et al. |
| 6,169,691 B1 | 1/2001 | Pasotti et al. |
| 6,175,523 B1 | 1/2001 | Yang et al. |
| 6,181,605 B1 | 1/2001 | Hollmer et al. |
| 6,201,282 B1 | 3/2001 | Eitan |
| 6,205,056 B1 | 3/2001 | Pan et al. |
| 6,215,148 B1 | 4/2001 | Eitan |

| | | | |
|---|---|---|---|
| 6,215,702 B1 | 4/2001 | Derhacobian et al. | |
| 6,218,695 B1 | 4/2001 | Nachumovsky | |
| 6,222,768 B1 | 4/2001 | Hollmer et al. | |
| 6,240,032 B1 | 5/2001 | Fukumoto | |
| 6,240,040 B1 | 5/2001 | Akaogi et al. | |
| 6,256,231 B1 | 7/2001 | Lavi et al. | |
| 6,266,281 B1 | 7/2001 | Derhacobian et al. | |
| 6,272,047 B1 | 8/2001 | Mihnea et al. | |
| 6,282,145 B1 | 8/2001 | Tran et al. | |
| 6,285,574 B1 | 9/2001 | Eitan | |
| 6,292,394 B1 | 9/2001 | Cohen et al. | |
| 6,304,485 B1 | 10/2001 | Harari et al. | |
| 6,331,950 B1 | 12/2001 | Kuo et al. | |
| 6,348,711 B1 | 2/2002 | Eitan | |
| 6,396,741 B1 | 5/2002 | Bloom et al. | |
| 6,490,204 B2 | 12/2002 | Bloom et al. | |
| 2002/0004921 A1 * | 1/2002 | Muranaka et al. | 714/704 |
| 2002/0064911 A1 | 5/2002 | Eitan | |
| 2002/0132436 A1 | 9/2002 | Eliyahu et al. | |
| 2002/0191465 A1 | 12/2002 | Maayan et al. | |
| 2003/0155659 A1 * | 8/2003 | Verma et al. | 257/777 |

OTHER PUBLICATIONS

Roy, Anirban "Characterization and Modeling of Charge Trapping and Retention in Novel Multi–Dielectic Nonvolatile Semiconductor Memory Device," Doctoral Dissertation, Sherman Fairchild Center, Department of Computer Science and Electrical Engineering, pp. 1–35, 1989.

"2 Bit/Cell EEPROM Cell Using Band–To–Band Tunneling For Data Read–Out," IBM Technical Disclosure Bulletin, US IBM Corp. NY vol. 35, No 4B, ISSN: 0018–88689, Sep., 1992.

Hsing–Huang Tsent et al. "Thin CVD Gate Dielectric for USLI Technology",IEEE, 0–7803–1450–6, 1993.

Pickar, K.A., "Ion Implementation in Silicon," Applied Solid State Science, vol. 5, R. Wolfe Edition, Academic Press, New York, 1975.

Bruno Ricco, "Nonvolatile Multilevel Memories for Digital Applications", IEEE, vol. 86, No. 12, issued Dec. 1998, pp. 2399–2421.

Chang, J., "Non Vollatile Semiconductor Memory Devices," Proceeding of the IEEE, vol. 64 No. 7, Issued Jul. 1976.

Ma et al., "A dual–bit Split–Gate EEPROM (DSG) Cell in Contactless Array for Single–Vcc High Density Flash Memories", IEEE, pp. 3.5.1–3.5.4, 1994.

Oshima et al., "Process and Device Technologies for 16Mbit Eproms with Large—Tilt—Angle Implemented P–Pocket Cell," IEEE, CH2865–4/90/0000–0095, pp. 5.2.1–5.2.4, 1990.

Lee, H., "A New Approach For the Floating–Gate MOS NonVolatile Memory", Applied Physics Letters, vol. 31, No. 7, pp. 475–476, Oct. 1977.

Bhattacharyya et al., "FET Gate Structure for Nonvolatile N–Channel Read–Mostly Memeory Devices," IBM Technical Disclosure Bulletin, US IBM Corp. vol. 18, No. 6, p. 1768, 1976.

Bude et al., "EEPROM/Flash Sub 3.0V Drain—Source Blas Hot Carrier Writing", IEDM 95, pp. 989–992.

Bude et al., "Secondary Electron Flash—a High Performance, Low Power Flash Technology for 0.35 μm and Below", IEDM 97, pp. 279–282.

Bude et al., "Modeling Nonequilibrium Hot Carrier Device Effects", Conferences of Insulator Specialists of Europe, Sweden, Jun., 1997.

Glasser et al., "The Design and Analysis of VLSI Circuits", Addison Wesley Publishing Co, Chapter 2, 1988.

Jung et al., "A 117–$mm^2$ 3.3V Only 128–Mb Multilevel NAND Flash Memory for Mass Storage Applications" IEEE Journal of Solid–State Circuits, vol. 31, No. 11, Nov. 1996, pp. 1575–1583.

Campardo et al., "40$mm^2$ 3–V–Only 50 MHz 64–Mb 2–b/cell CHE NOR Flash Memory", IEEE Journal of Solid–State Circuits, vol. 35, No. 11, Nov. 2000, pp. 1655–1667.

Lin et al., "Novel Source–Controlled Self–Verified Programming for Multilevel EEPROM's", IEEE Transactions on Electron Devices, vol. 47, No. 6, Jun. 2000, pp. 1166–1174.

Eitan, U.S. patent application No. 08/905,286, filed Aug. 1, 1997.

Eitan, U.S. patent application No. 09/536,125, filed Mar. 28, 2000.

Avni et al., U.S. patent application No. 09/730,586, filed Dec. 7, 2000.

Eitan et al., U.S. patent application No. 08/902,890, filed Jul. 30, 1997.

* cited by examiner

HIGH VOLTAGE INSERTION IN FLASH MEMORY CARDS

FIELD OF THE INVENTION

The present invention relates generally to flash memory cards, and particularly to methods and apparatus for high voltage insertion in flash memory cards.

BACKGROUND OF THE INVENTION

Small removable mass storage devices, constructed in the form of flash memory cards, are well known in the art. Flash memory cards, also referred to simply as flash cards, generally comprise non-volatile flash memories, and have become increasingly popular for use with digital cameras, digital music players, smart cellular phones, laptops and handheld devices, such as, but not limited to, personal digital assistants (PDAs).

One well-known kind of flash card is the "CompactFlash™" card, which is particularly popular for use with digital cameras. CompactFlash was first introduced in 1994 by SanDisk Corporation. The size of a CompactFlash card is typically 43 mm×36 mm×3.3 mm. The CompactFlash card typically has 50 pins, as opposed to a 68-pin PCMCIA (Personal Computer Memory Card International Association) card, and is about one-fourth the volume of the PCMCIA card. Yet the CompactFlash card may provide complete PCMCIA functionality and compatibility. The CompactFlash card may support more than one voltage input, such as 3.3 and 5 volts. The CompactFlash card also includes an onboard card interface controller that may increase performance, particularly on devices that have slow processors.

Another type of flash memory card is the "MemoryStick™" made by Sony, which may be used with digital cameras for additional storage. It uses a 10-pin connector and uses a serial data transfer method to move the data. It typically operates at 2.7 V to 3.6 V, and has dimensions of about 21.5 mm×50 mm×2.8 mm.

Another popular flash memory card is the MultiMediaCard (MMC) made by Siemens/SanDisk and also available from Infincon. The MMC is even smaller than the aforementioned cards, typically being the size of a postage stamp. For example, a 32 MB MultiMedia Card may measure 32 mm×24 mm×1.2 mm, and weigh less than 1.5 g. It operates at 2.7 to 3.6 volts, and may be used with cellular phones, PDAs (Personal Digital Assistants), music players and electronic organizers. Smaller size MMCs are also available.

Yet another type of flash memory card is the Secure Digital (SD) card from SanDisk. SD cards are similar in shape to MMC cards, but thicker, such as about 2.1 mm thick.

Small flash memory cards, especially the MMC, are typically stored and carried in plastic or metal pouches or cases with pockets for slipping the cards therein.

Reference is now made to FIG. 1, which illustrates a typical flash memory card 10 that also includes a card interface controller 12, such as but not limited to, the CompactFlash card. Flash memory card 10 typically includes a plurality of pads, which may comprise a plurality of control pads 14 and a plurality of inlet/outlet (I/O) pads 16. The control pads 14 may be used to communicate control signals and data between controller 12 and a user device (not shown), such as but not limited to, digital cameras, music players, cellular phones, laptops and PDAs. The I/O pads 16 may be used to communicate other input and output data between controller 12 and the user device.

Flash memory card 10 may comprise one or more memories 18, such as but not limited to, electrically erasable, programmable read only memories (EEPROMs). The controller 12 may serve as the interface in communication between memory 18 and the user device. Memory 18 may typically support high voltage functionality, such as, programming and erasing. On the other hand, controller 12 is usually not manufactured with EEPROM or flash technology, but rather with less expensive and more suitable processes, such as but not limited to, CMOS (complementary metal oxide silicon) processes. Accordingly, controller 12 typically does not require, and moreover cannot tolerate, high voltage for its functionality (e.g., voltage levels above Vdd).

The conflict in voltage characteristics between controller 12 and memory 18 may pose a problem. It would be advantageous to insert high voltage to memory 18, because high voltage may enable faster programming and erasing, and may be important for other functionalities, such as debugging. There are many applications where high voltage may be easily supplied to the card 10, such as from a mains outlet. However, memory 18 communicates with control pads 14 and I/O pads 16 only through controller 12. Since controller 12 is typically a low voltage component, it may not tolerate high voltage insertion. Thus, the low voltage restriction of controller 12 may prevent inserting high voltage in memory 18.

SUMMARY OF THE INVENTION

The present invention seeks to provide an improved flash memory card, which enables high voltage insertion in memories of such cards. In one embodiment of the invention, a high voltage switch logic module may be in communication with a control pad, a controller and one or more memories of the flash memory card. The high voltage switch logic module may selectively route voltage from the control pad to the controller or the memory. If the voltage input to the control pad does not exceed a predefined level, e.g., Vdd, then the voltage may be routed to the controller. If the voltage input to the control pad exceeds the predefined level, then the voltage may be routed to the memory. In such a manner, high voltage may be inserted in the memory, while at the same time circumventing the low voltage controller. The controller is protected from high voltage insertion and there is no need to modify any of the pads that already exist in flash memory cards.

There is thus provided in accordance with an embodiment of the present invention a flash memory card comprising a controller, at least one control pad, at least one memory, and a high voltage switch logic module in communication with the at least one control pad, the controller and the at least one memory, the high voltage switch logic module being adapted to selectively route voltage from the at least one control pad to one of the controller and the at least one memory.

In accordance with an embodiment of the present invention the high voltage switch logic module comprises a mode of operation wherein if a voltage input to the at least one control pad does not exceed a predefined level, then the high voltage switch logic module routes voltage from the at least one control pad to the controller. The predefined level may be in a range between ground (0 V) and Vdd. Alternatively, the predefined level may be in a range between ground and a power supply voltage level of the controller. Still alternatively, the predefined level may be higher than a power supply voltage level of the controller.

Further in accordance with an embodiment of the present invention the voltage routed to the controller is in a voltage range between ground and a power supply voltage level of the controller.

Still further in accordance with an embodiment of the present invention the high voltage switch logic module comprises a mode of operation wherein if a voltage input to the at least one control pad exceeds a predefined level, then the high voltage switch logic module routes voltage from the at least one control pad to the at least one memory. The predefined level may be higher than Vdd. Alternatively, the predefined level may be higher than the power supply voltage level of the controller.

In accordance with an embodiment of the present invention the high voltage switch logic module is adapted to direct a portion of the voltage input to the at least one control pad to the controller. The portion of the voltage may comprise Vdd or may be at a level of the power supply of the controller, for example.

There is also provided in accordance with an embodiment of the present invention a method comprising determining if a voltage input to a control pad of a flash memory card exceeds a predefined level, the flash memory card comprising a controller and at least one memory, and routing voltage from the control pad to the controller if the voltage input does not exceed the predefined level.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
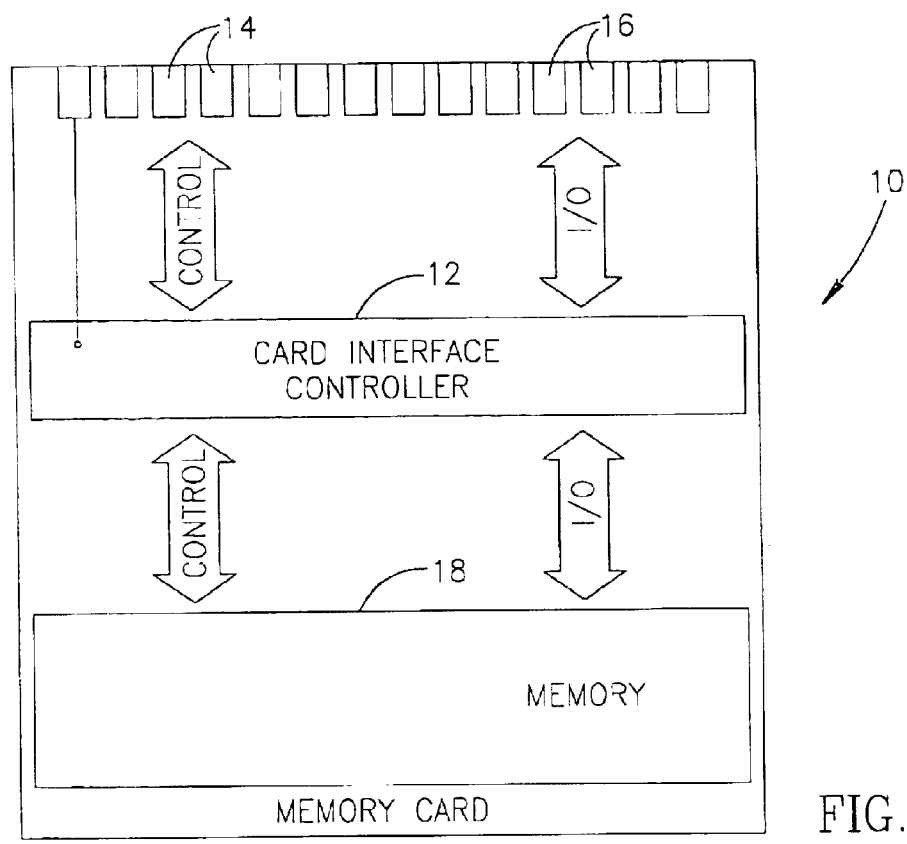
FIG. 1 is a simplified pictorial illustration of a typical flash memory card.
Figure 2:
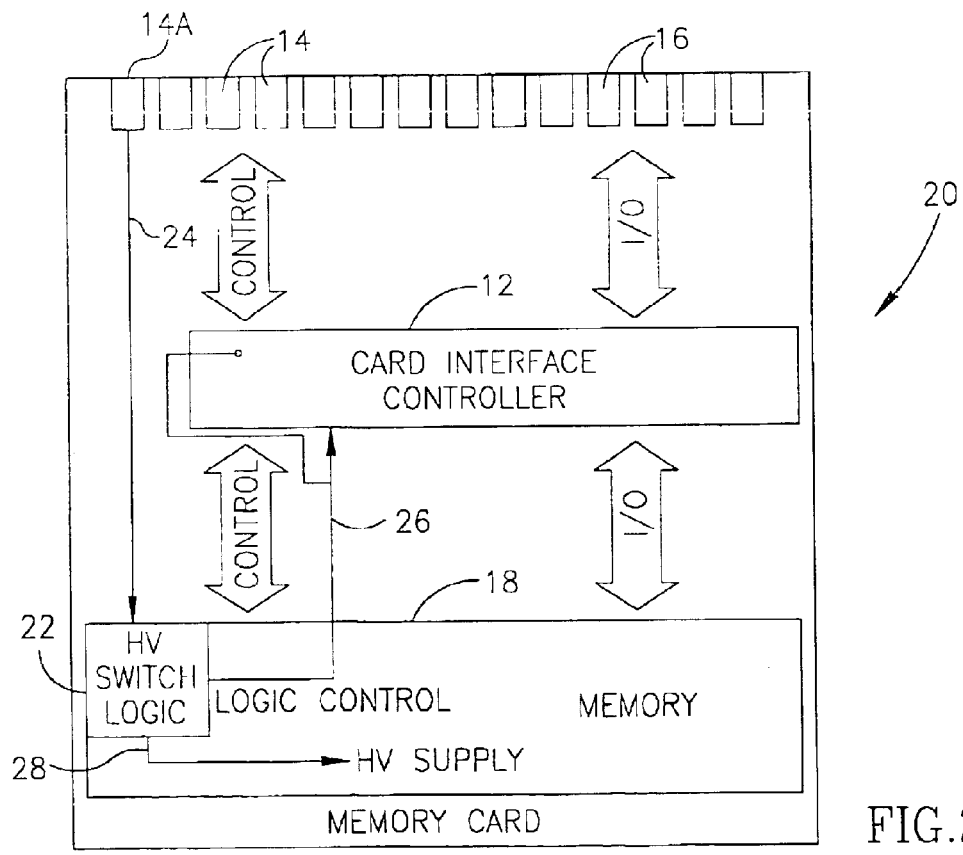
FIG. 2 is a simplified pictorial illustration of a flash memory card with provision for high voltage insertion to a memory or memories in the card, constructed and operative in accordance with an embodiment of the present invention.

Reference is now made to FIG. 2, which illustrates a flash memory card 20, constructed and operative in accordance with an embodiment of the present invention. Flash memory card 20 may be any size or form of flash memory card, such as but not limited to, a CompactFlash™ card.

In accordance with an embodiment of the invention, a high voltage switch logic module 22 is in communication with one of the control pads 14, referred to as control pad 14A, such as by a hard wire connection 24. High voltage switch logic module 22 may route the voltage from the control pad 14A to either controller 12 or memory 18. High voltage switch logic module 22 may comprise part of memory 18, or may be manufactured separately therefrom.

Figure 3:
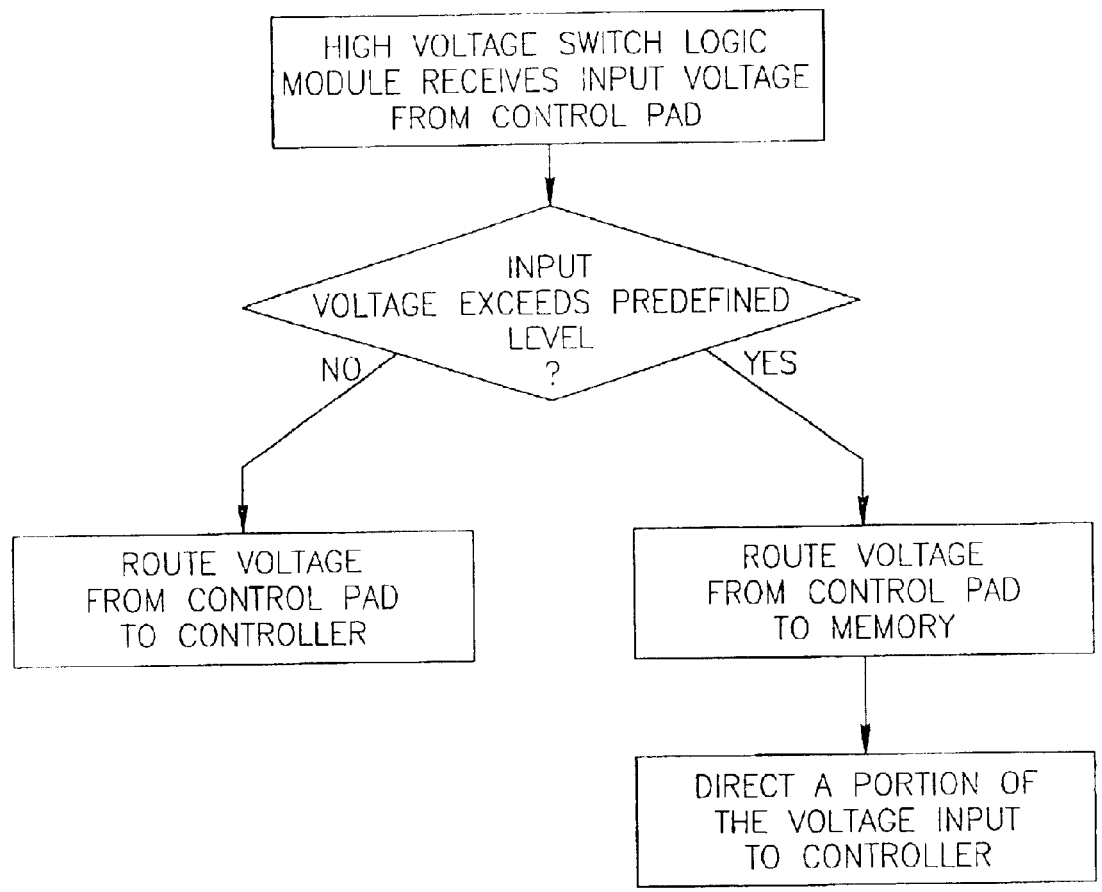
FIG. 3 is a simplified flow chart of a method for inserting high voltage to a memory or memories of a flash memory card, using a high voltage switch logic module, in accordance with an embodiment of the present invention.

As seen in FIG. 3, if high voltage switch logic module 22 detects that the input voltage to control pad 14A does not exceed a predefined level, that voltage from control pad 14A is routed to controller 12, as indicated by arrow 26 in FIG. 2. For example, in normal usage, control pad 14A may receive voltage in a range between ground (0 V) and the power supplied to card 20 (Vdd). Accordingly, if the voltage input to control pad 14A does not exceed Vdd, the voltage is routed to controller 12. Another suitable value for the predefined voltage level may be a power supply voltage level of controller 12, or a voltage level less or greater than the power supply voltage level of controller 12.

If it is desired to insert high voltage to memory 18, then the high voltage may be input to control pad 14A. The high voltage switch logic module 22 detects that the input voltage to control pad 14A exceeds the predefined level, and routes the voltage from control pad 14A to memory 18, as indicated by arrow 28 in FIG. 2. The high voltage switch logic module 22 may (e.g., simultaneously) direct a portion of the voltage input to control pad 14A to controller 12, such as Vdd.

It is noted that the high voltage routing may be completely internal to the flash memory card 20, such that the user device may not be aware of any internal routing. Moreover, the invention does not need to modify any of the pads that already exist in flash memory cards.

It will be appreciated by person skilled in the art, that the present invention is not limited by what has been particularly shown and described herein above. Rather the scope of the present invention is defined only by the claims that follow:

What is claimed is:

1. A flash memory card comprising:
   a controller;
   at least one control pad;
   at least one memory; and
   a high voltage switch logic module in communication with said at least one control pad, said controller and said at least one memory, said high voltage switch logic module being adapted to selectively route voltage from said at least one control pad to one of said controller and said at least one memory.

2. The flash memory card according to claim 1, wherein said high voltage switch logic module comprises a mode of operation wherein if a voltage input to said at least one control pad does not exceed a predefined level, then said high voltage switch logic module routes voltage from said at least one control pad to said controller.

3. The flash memory card according to claim 2, wherein said predefined level is in a range between ground (0 V) and Vdd.

4. The flash memory card according to claim 2, wherein said predefined level is in a range between ground and a power supply voltage level of said controller.

5. The flash memory card according to claim 2, wherein said predefined level is higher than a power supply voltage level of said controller.

6. The flash memory card according to claim 2, wherein said voltage routed to said controller is in a voltage range between ground and a power supply voltage level of said controller.

7. The flash memory card according to claim 1, wherein said high voltage switch logic module comprises a mode of operation wherein if a voltage input to said at least one control pad exceeds a predefined level, then said high voltage switch logic module routes voltage from said at least one control pad to said at least one memory.

8. The flash memory card according to claim 7, wherein said predefined level is higher than Vdd.

9. The flash memory card according to claim 7, wherein said predefined level is higher than the power supply voltage level of said controller.

10. The flash memory card according to claim 7, wherein said high voltage switch logic module is adapted to direct a portion of the voltage input to said at least one control pad to said controller.

11. The flash memory card according to claim 10, wherein said portion of the voltage comprises Vdd.

12. The flash memory card according to claim 10, wherein said portion of the voltage is at a level of the power supply of said controller.

13. A method comprising:
- determining if a voltage input to a control pad of a flash memory card exceeds a predefined level, said flash memory card comprising a controller and at least one memory; and
- routing voltage from said control pad to said controller if said voltage input does not exceed said predefined level.

14. The method according to claim 13, wherein said predefined level is in a range between ground (0 V) and Vdd.

15. The method according to claim 13, wherein said predefined level is between ground and a power supply voltage level of said controller.

16. The method according to claim 13, wherein said predefined level is higher than a power supply voltage level of said controller.

17. The method according to claim 13, wherein said voltage routed to said controller is in a voltage range between ground and a power supply voltage level of said controller.

18. The method according to claim 13, further comprising routing voltage from said control pad to said at least one memory if said voltage input exceeds said predefined level.

19. The method according to claim 18, wherein said predefined level is in a range between ground (0 V) and Vdd.

20. The method according to claim 18, wherein said predefined level is between ground and a power supply voltage level of said controller.

21. The method according to claim 18, wherein said predefined level is higher than a power supply voltage level of said controller.

22. The method according to claim 18, further comprising directing a portion of the voltage input to said control pad to said controller.

23. The method according to claim 22, wherein said portion of the voltage comprises Vdd.

24. The method according to claim 22, wherein said portion of the voltage is not higher than a power supply voltage level of the controller.

\* \* \* \* \*